(12) United States Patent
Martines et al.

(10) Patent No.: US 7,304,896 B2
(45) Date of Patent: Dec. 4, 2007

(54) METHOD AND CIRCUIT FOR SIMULTANEOUSLY PROGRAMMING MEMORY CELLS

(75) Inventors: Ignazio Martines, Tremestieri Etneo (IT); Michele La Placa, Cefalù (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 54 days.

(21) Appl. No.: 11/279,663

(22) Filed: Apr. 13, 2006

(65) Prior Publication Data
US 2006/0245269 A1   Nov. 2, 2006

(30) Foreign Application Priority Data
Apr. 13, 2005   (IT) .......................... VA2005A0024

(51) Int. Cl.
*G11C 7/10* (2006.01)
(52) U.S. Cl. ..................... 365/189.04; 365/185.03; 365/185.24; 365/185.33
(58) Field of Classification Search ........... 365/189.04, 365/185.03, 185.22, 185.24, 185.33
See application file for complete search history.

(56) References Cited

U.S. PATENT DOCUMENTS 6,031,760 A * 2/2000 Sakui et al. ........... 365/185.21
7,085,167 B2 * 8/2006 Lee et al. .............. 365/185.22
7,136,304 B2 * 11/2006 Cohen et al. ........... 365/185.19
2004/0130946 A1   7/2004 Uribe et al. ........... 365/185.03

* cited by examiner

*Primary Examiner*—Richard T. Elms
*Assistant Examiner*—Toan Le
(74) *Attorney, Agent, or Firm*—Lisa K. Jorgenson; Allen, Dyer, Doppelt, Milbrath & Gilchrist, P.A.

(57) ABSTRACT

A method for simultaneously programming a pre-established number of memory cells includes setting an initial number of memory cells to be simultaneously programmed equal to the pre-established number, and subdividing the initial number of memory cells to be programmed into subsets of memory cells. A program operation for simultaneously programming all the memory cells of each subset of memory cells is executed by forcing a current through all the memory cells of each subset of memory cells. The current has a program voltage associated therewith. The program voltage is compared to a threshold voltage during execution of the program operation. The method further includes stopping execution of the program operation if the threshold voltage is surpassed, reducing the initial number of memory cells to be simultaneously programmed, and restarting from the subdividing.

21 Claims, 4 Drawing Sheets

METHOD AND CIRCUIT FOR SIMULTANEOUSLY PROGRAMMING MEMORY CELLS

FIELD OF THE INVENTION

The invention relates to memory devices, and more particularly, to a method and a circuit for simultaneously programming memory cells.

BACKGROUND OF THE INVENTION

In non-volatile FLASH memory devices, the erase operation is a destructive operation in the sense that it leads to a loss of information and involves a whole sector. The program operation involves recording information, and generally takes place by writing a byte, word or a similar unitary piece of information at the time. There are particular cases in which it is necessary to program a large number of words. For example, during a test phase for simultaneously stressing as many cells as possible, or in a user mode after having erased a sector for recovering as many depleted cells as possible.

Generally, this is an operation that may cause problems. For instance, if the number of bitlines to be simultaneously programmed is very large, the current absorption may exceed the internal charge pump generator capabilities. An approach that is normally adopted involves setting a reasonable number of bitlines to be programmed simultaneously such that the cumulative current to be absorbed can be adequately delivered by the charge pump generator.

A typical algorithm for carrying out this operation is highlighted in FIG. 1. With the variable N being the number of simultaneously programmable bitlines, and with M*N being the total number of bitlines of the sector that is to be programmed, the following steps are carried out: N bitlines are programmed at a time; the program operation is repeated on the same word of N bitlines as long as the operation is verified to be successfully completed; and the above steps are repeated M times.

An attempt to program a first group of $N_{MAX}$ memory cells (SET N=$N_{MAX}$) is carried out. The fact that it is a first attempt (TENT=1) to program the word is recorded, and a program operation is initiated (Program). Once the program operation has ended, the word of $N_{MAX}$ cells is verified for checking whether it has been correctly programmed (DATO=OK?). If a first verification fails, this process is repeated ($T_{ENT}$=$T_{ENT}$+1) for a number of times equal to a pre-established maximum number of attempts (TENT=$M_{AX}$). If this latter condition is verified, the programming algorithm is stopped for signaling that the memory location contains failing cells ($F_{AIL}$).

If all $N_{MAX}$ cells of the first group have been programmed correctly (DATO=OK?), it is checked whether the last groups (or word) of $N_{MAX}$ cells has been reached (LAST_ADD?), and if so, the program operation is terminated. Otherwise, the successive group of $N_{MAX}$ cells (ADD=ADD+1) is selected and the same sequence of steps as specified above is repeated.

Simultaneous programming is effective if the number of iterations required equals the minimum number of iterations $$\frac{N \cdot M}{N_{MAX}}.$$

The above described method has the following drawbacks. The number N of bitlines to be programmed simultaneously is established based on past experience and on the knowledge of the fabrication process used. In general, it is very difficult to establish a priori a tolerable maximum number N for a simple memory device, or for the devices on the same wafer, or even for a lot of wafers.

Another drawback is that in general, because of the difficulty to know exactly the number N, the number N is either underestimated or overestimated. If the number N is underestimated, too few bitlines are programmed at the time, and the number of iterations required for programming all the bitlines is increased. If the number N is overestimated because of the above mentioned overload situation, there are two consequences.

A first consequence is that the program operation is started in any case. For successfully programming each group of N bitlines, the number of program-verify iterations becomes relatively large. As a matter of fact, the advantage of speeding up the program operation by increasing the number N of bitlines to be programmed at the same time is jeopardized by weakened program steps.

A second consequence is that the programming of a group of N bitlines is never achieved. This is because typically, when the program-verify algorithm has been repeated for a set maximum number of attempts, a fail is flagged during the test mode, or a system error flag is generated during a used mode.

Therefore, the problem appears to be significant: maximizing the number of cells that are simultaneously programmed saves time. However, if the number of bitlines N is set too large, the programming may never be correctly completed.

Published U.S. Patent Application No. 2004/0130946 discloses a method for simultaneously programming more bitlines of a FLASH memory. According to this method, a certain number of bitlines are simultaneously programmed, then it is checked whether the programming of these bitlines has been carried out correctly. If this condition is not verified, the number of bitlines to be simultaneously programmed is decremented, and the program operation is carried out again.

A drawback of this method is that for establishing whether too many bitlines at the time are being programmed, it is necessary to program a group of bitlines and then, after the program operation is terminated, to verify whether they have been correctly programmed or not. Even this method is more convenient than other known methods, wherein the number of bitlines to be programmed simultaneously is pre-established. Nonetheless, this method for programming a FLASH memory is not significantly shortened.

SUMMARY OF THE INVENTION

In view of the foregoing background, an object of the invention is to provide a method and a relative circuit for simultaneously programming memory cells that overcomes the above limitations and inconveniences.

According to the invention, the number of bitlines of memory to be programmed simultaneously is initially set at a certain pre-established maximum number, then a routine for programming simultaneously the set maximum number of cells is carried out.

A particular feature of the invention is that the program routine is immediately stopped if too many cells appear to be simultaneously programmed. When too many cells are being programmed, this may be immediately understood without waiting to the end of the routine by observing the voltage variations on the program voltage distribution line.

According to the invention, while executing a program step, the voltage on the line at a programming voltage that supplies the current absorbed by the bitlines being simultaneously programmed, is constantly monitored. If this voltage drops below a certain threshold, the program operation is immediately stopped. The number of bitlines to be programmed simultaneously is decremented, and the program operation is resumed on the decremented number of bitlines.

Thus, it is no longer necessary to wait until the completion of a program operation. This is because if the programming voltage drops below the set threshold, the bitlines are not being programmed correctly or in any case would not be programmed correctly.

The method of the invention is implemented in a circuit for programming simultaneously the memory cells. The circuit may comprise a voltage comparator for comparing a program voltage with a reference voltage for generating an error flag when the program voltage threshold is surpassed. A control circuitry is input with the error flag, which enables the simultaneous program operation of the memory cells. The control circuitry may even be conveniently implemented by a processor that carries out a software code for implementing the method of the invention.

BRIEF DESCRIPTION OF THE DRAWINGS

A preferred embodiment of the invention is described referring to the attached drawings, wherein.

DETAILED DESCRIPTION OF THE PREFERRED EMBODIMENTS

According to the method of the invention, a programming voltage is continuously monitored by comparing it with a threshold voltage. Eventually, the program operation is stopped and the number of cells to be programmed simultaneously is reduced as soon as it overcomes the threshold voltage.

Figure 3:
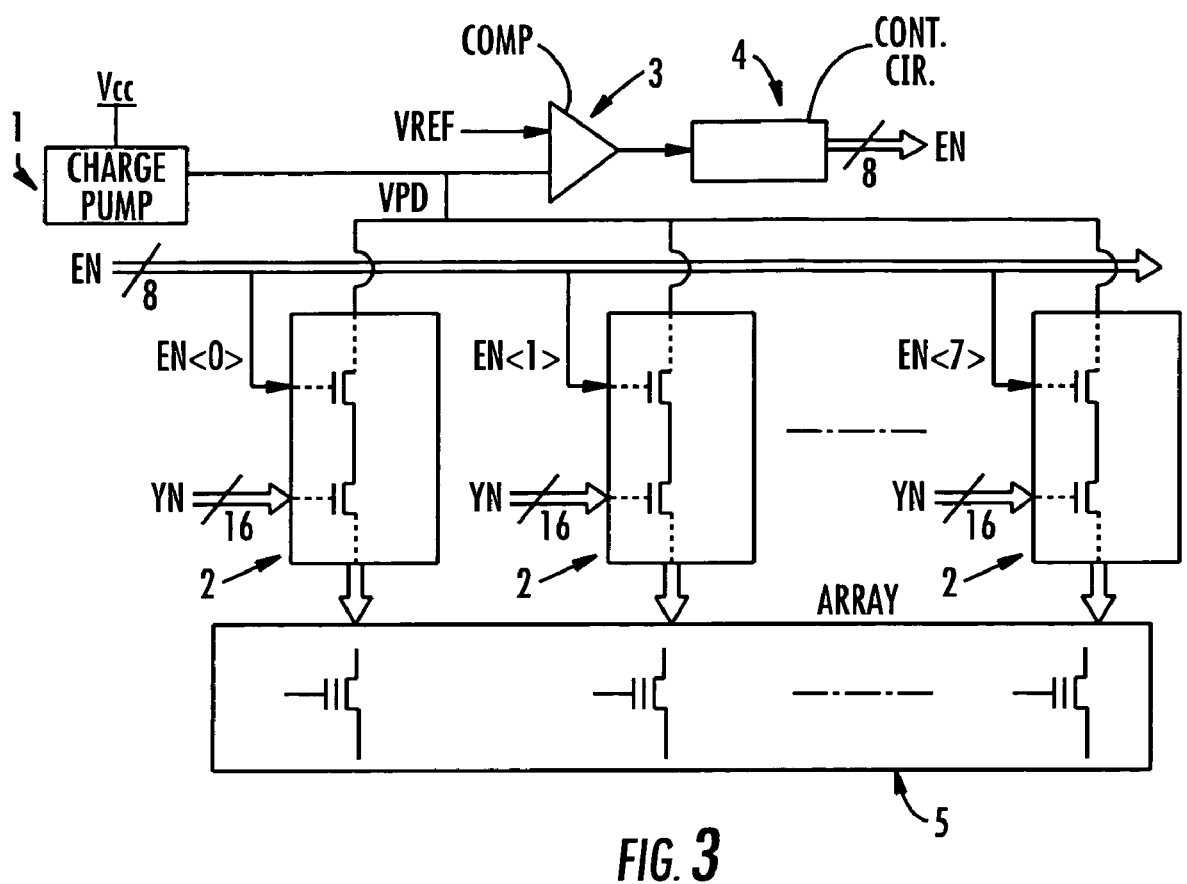
FIG. 3 is a schematic diagram of a programming circuit connected to an array of memory bitlines to be programmed in accordance with the invention.

FIG. 3 shows a block diagram of the program circuit of the invention connected to the bitlines to be programmed. The program circuit comprises a charge pump 1, enabling and column decoding transistors 2, and a comparator 3 for comparing the threshold voltage Vpd with the threshold Vref that generates an error flag when the threshold is surpassed. The program circuit further comprises control circuitry 4 that cooperates with the comparator 3 for implementing the method of the invention, and an array of cells 5 (bitline) to be programmed. The group of bitlines to be simultaneously programmed are selected by the enabling/disabling signals EN, and the selection signals YN.

Figure 1:
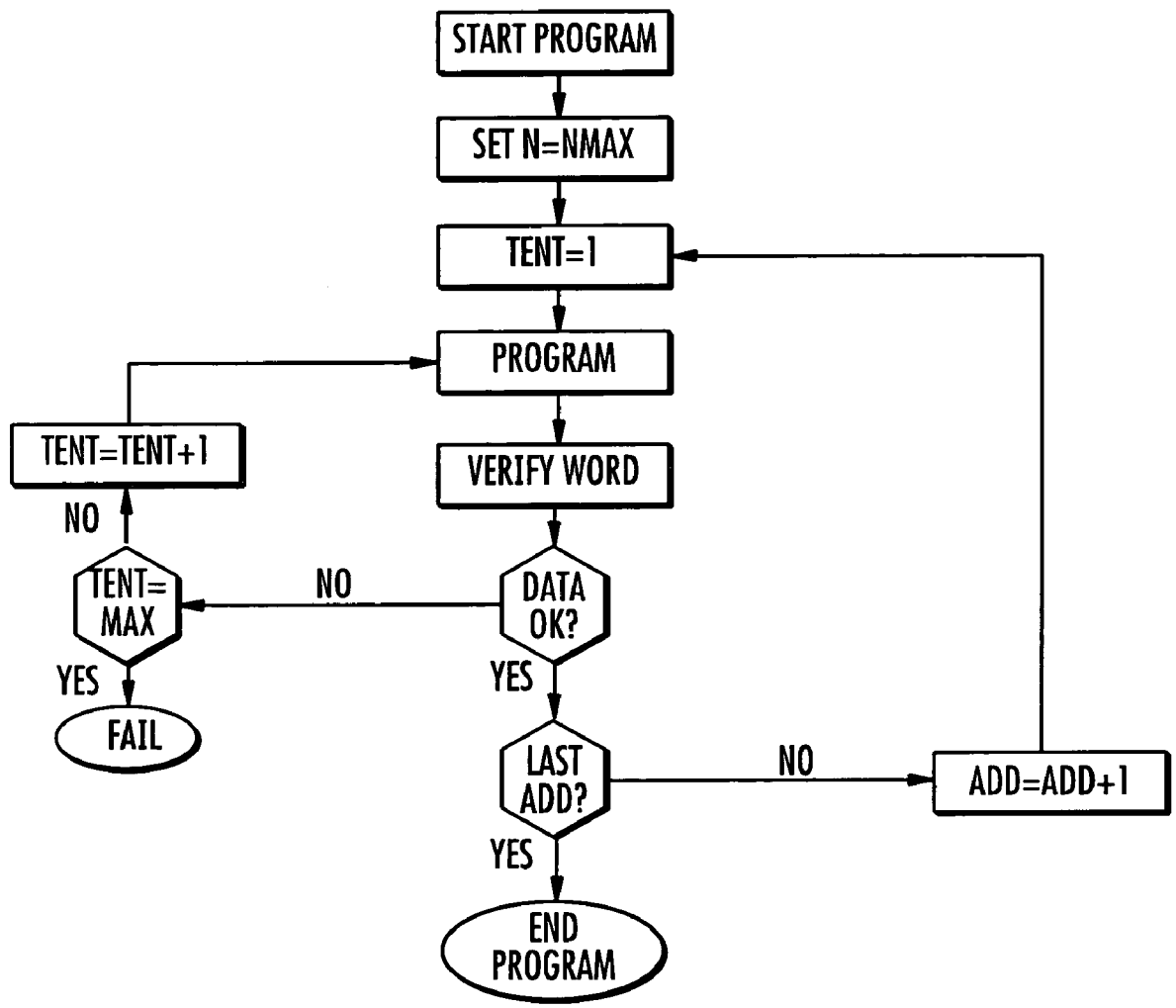
FIG. 1 illustrates an algorithm for simultaneously programming memory cells in accordance with the prior art.
Figure 2A:
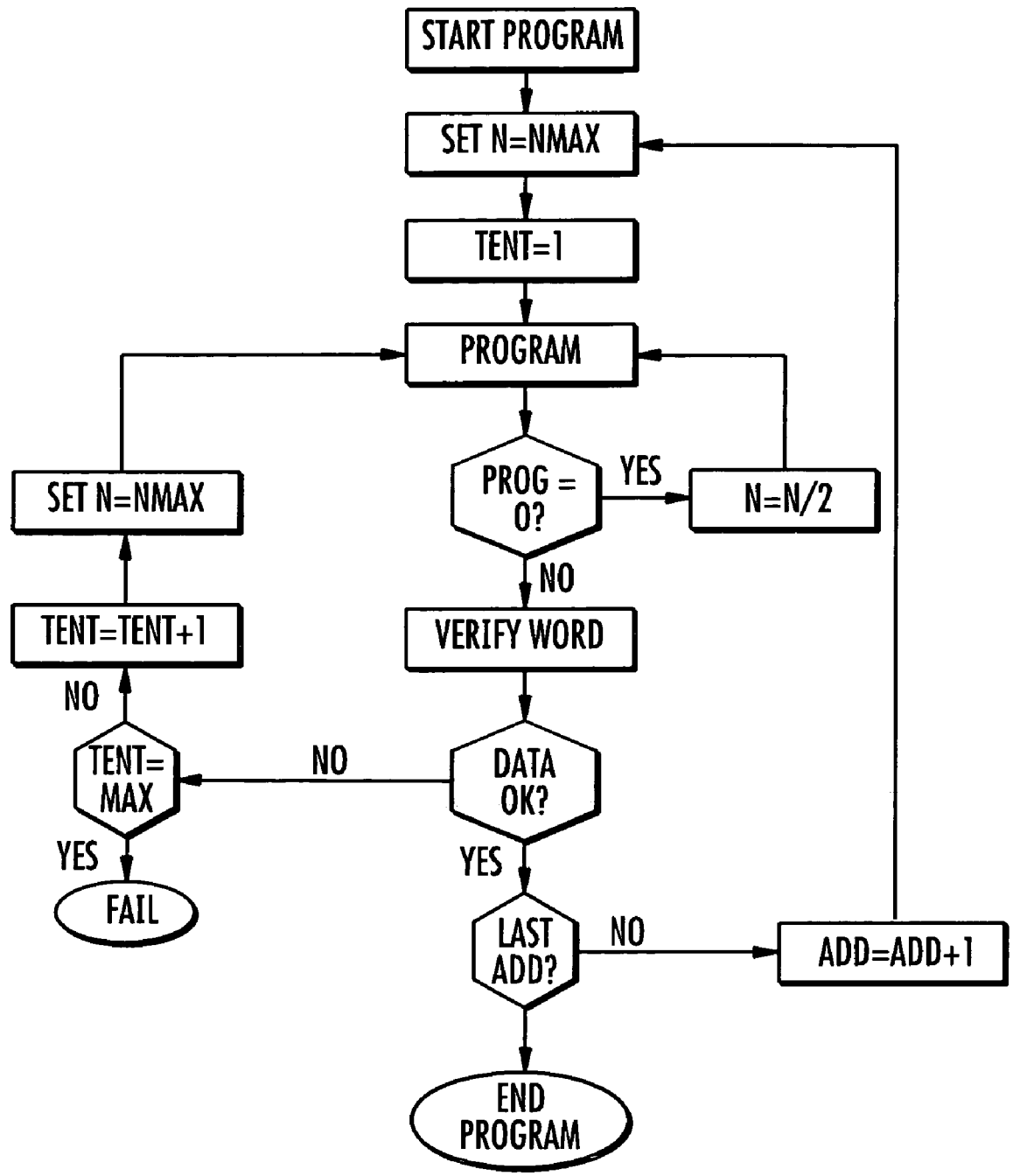
FIGS. 2a and 2b are flow diagrams illustrating the method in accordance with the invention.
Figure 2B:
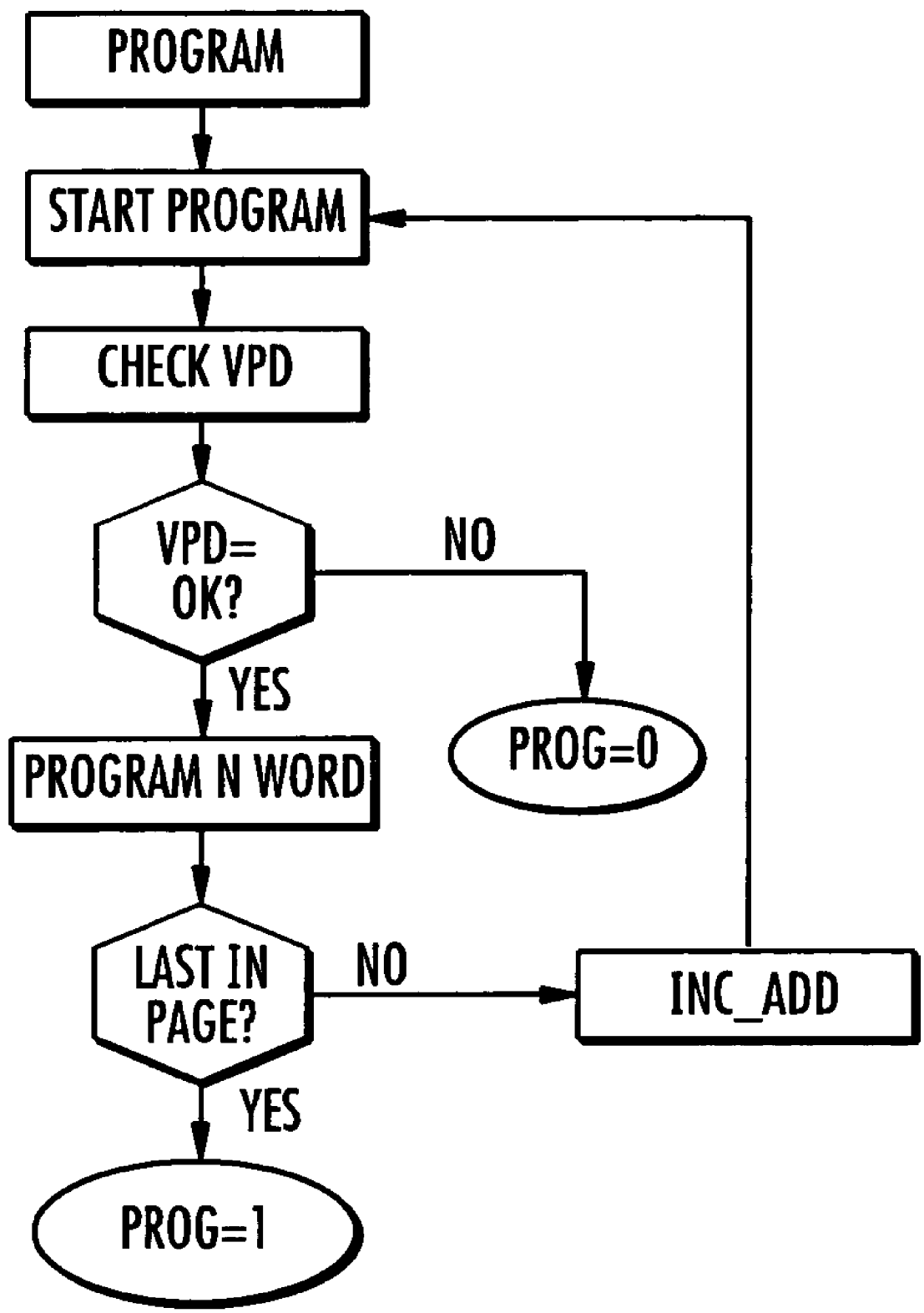

The algorithm implemented by the program circuit is schematically illustrated in FIGS. 2a and 2b. In particular, FIG. 2b shows the program operation Program executed by the main algorithm, and the step (VPD=OK?) for monitoring the program voltage. The program operation manages the programming of the packets of N bitlines in which the original packet has been divided, and also manages the increment of addresses (INC_ADD) and verification of the end of the program operation on the whole packet (LAST_IN_PAGE?). The operation asserts a flag (PROG) that indicates whether the operation has aborted (PROG=0), or the program operation has been correctly carried out (PROG=1).

The flag PROG indicates only whether it is possible or not to program N cells at a time without diminishing the voltage Vpd. When the program operation ends, it is not yet known how many bitlines have been correctly programmed. This control is carried out successively by the algorithm of the invention (DATO_OK?).

An attempt to program a first group of $N_{MAX}$ bitlines is carried out (SET N=$N_{MAX}$). The fact that it is the first attempt to program the bitlines is recorded (TENT=1), and a program operation is carried out (Program). During the execution of this operation, the program voltage Vpd is continuously monitored (CHECK VPD). If the voltage Vpd does not surpass the threshold voltage (VPD=OK), the $N_{MAX}$ bitlines are programmed simultaneously (PROGRAM NWORD).

If the voltage Vpd surpasses the threshold voltage Vref during the execution of the program operation, then this means that too many bitlines at the time are being programmed. The program operation is stopped (PROG=0) and the comparator 3 asserts the error flag. The control circuitry 4 reduces the number of bitlines to be programmed simultaneously, and carries out the operation for programming this reduced number of bitlines at one time.

According to a preferred embodiment, when the voltage Vpd surpasses the threshold Vref, the number of bitlines to be programmed simultaneously is halved (N=N/2). In this case, if the program operation is executed correctly, then the $N_{MAX}$ bitlines have been programmed in two program cycles.

In contrast, if it is not possible to carry out the program operation on $N_{MAX}/2$ bitlines at a time, then the control circuitry 4 preferably will further halve ($N_{MAX}/4$) the number of bitlines to be programmed at a time, and so on.

When the first $N_{MAX}$ bitlines have been programmed, the routine for programming simultaneously a second group of $N_{MAX}$ bitlines is carried out. The above process steps will be carried out again, as far as the whole memory sector is programmed.

The advantages of this approach are immediately evident. For the chosen value N, if a process failure or a concentration of bitlines in the memory partition takes place, and the absorbed current reduces the voltage Vpd, then the algorithm further halves this number such that the current absorbed by the addressed partition is smaller. Thus, it may be sustained by the charge pump.

It is convenient to halve progressively the number of bitlines to be programmed simultaneously when the program operation fails because it is simpler to manage the addresses of the bitlines to be programmed. If the number of bitlines that are simultaneously programmed is the maximum $N_{MAX}$, the program operation ends with the assertion of the flag PROG=1.

In contrast, if the number N is not the maximum number $N_{MAX}$ but it is $N_{MAX}/2$, $N_{MAX}/4$ etc., then, referring to the memory represented in FIG. 3, the addresses of the bitlines to be programmed with a program operation are generated as follows.

If N=$N_{MAX}/2$, then through the bus EN the addresses from EN<0> to EN<3> are enabled to program a first packet of N/2 bitlines. The addresses from EN<4> to EN<7> are for programming the second packet of N/2 bitlines. Therefore, the condition LAST_IN_PAGE=YES is verified, and the flag PROG=1 is asserted.

If $N=N_{MAX}/4$, then through the bus EN the addresses EN<0> and EN<1> are activated for programming a first packet of N/4 bitlines. The addresses EN<2> and EN<3> are enabled for programming a second packet of N/4 bitlines. Thus, the addresses EN<4> and EN<5> and finally the addresses EN<6> and EN<7> are enabled. The condition LAST_IN PAGE=YES is verified, and PROG=1.

It is possible to extend the above operations when $N=N_{MAX}/m$, with m being an integer larger than 2. When the program operation is ended, if the memory word (that is the set of cells) to be programmed has been correctly programmed (DATO=OK?), it is checked whether it is the last word of the page (LASTADD?), and in this case the algorithm ends without signaling any error (END PROGRAM). If it is not the last word of the page (LASTADD?), the successive word is considered (ADD=ADD+1) and the program operation is repeated.

In contrast, if the word has not been correctly programmed (DATO=OK?), it is verified whether or not this has happened for a number of times TENT equal to a pre-established maximum MAX (TENT=MAX). If this condition is verified, the program algorithm is stopped and a signal that the memory contains defective bitlines is generated (FAIL). Otherwise, the counting of the attempts to program correctly the word is incremented by 1 (TENT=TENT+1), and the simultaneous programming of a number of bitlines equal to the pre-established maximum is repeated (SET $N=N_{MAX}$).

It is convenient to do so because it is very probable that there is a relevant number of already correctly programmed bitlines. Thus, it seems reasonable to try to program simultaneously the maximum possible number of bitlines with a good probability of succeeding.

With the method of the invention, the program operation is carried out simultaneously on the largest possible number of bitlines. Preferably, the control circuitry 4 is a processor that carries out a software code for implementing the steps of the method.

That which is claimed is:

1. A method for simultaneously programming a pre-established number of memory cells, the method comprising:
    setting an initial number of memory cells to be simultaneously programmed equal to the pre-established number;
    subdividing the initial number of memory cells to be programmed into subsets of memory cells;
    executing a program operation for simultaneously programming all the memory cells of each subset of memory cells by forcing a current through all the memory cells of each subset of memory cells, the current having a program voltage associated therewith;
    comparing the program voltage to a threshold voltage during execution of the program operation; and
    stopping execution of the program operation if the threshold voltage is surpassed, reducing the initial number of memory cells to be simultaneously programmed, and restarting from the subdividing.

2. A method according to claim 1, wherein the number of memory cells to be simultaneously programmed is iteratively halved each time the threshold voltage is surpassed.

3. A method according to claim 1, wherein if the threshold voltage is not surpassed by the program voltage, then further comprising:
    verifying that the memory cells of each subset of memory cells have been correctly programmed at the end of the program operation; and
    setting the number of memory cells to be simultaneously programmed equal to the pre-established number if the memory cells of each subset have been correctly programmed, and restarting from the subdividing.

4. A method according to claim 1, wherein the memory cells form a Flash memory.

5. A method according to claim 1, wherein a charge pump forces the current through all the memory cells of each subset of memory cells.

6. A method according to claim 1, wherein a comparator compares the program voltage to the threshold voltage.

7. A computer program to be executed on a computer for simultaneously programming a pre-established number of memory cells, and comprising:
    a first software module for setting an initial number of memory cells to be simultaneously programmed equal to the pre-established number;
    a second software module for subdividing the initial number of memory cells to be programmed into subsets of memory cells;
    a third software module for executing a program operation for simultaneously programming all the memory cells of each subset of memory cells by forcing a current through all the memory cells of each subset of memory cells, the current having a program voltage associated therewith;
    a fourth software module for comparing the program voltage to a threshold voltage during execution of the program operation; and
    a fifth software module for stopping execution of the program operation if the threshold voltage is surpassed, reducing the initial number of memory cells to be simultaneously programmed, and restarting from the second software module.

8. A computer program according to claim 7, wherein the number of memory cells to be simultaneously programmed is iteratively halved each time the threshold voltage is surpassed.

9. A computer program according to claim 7, wherein if the threshold voltage is not surpassed by the program voltage, then further comprising:
    a sixth software module for verifying that the memory cells of each subset of memory cells have been correctly programmed at the end of the program operation; and
    a seventh software module for setting the number of memory cells to be simultaneously programmed equal to the pre-established number if the memory cells of each subset have been correctly programmed, and restarting from the second software module.

10. A computer program according to claim 7, wherein the memory cells form a Flash memory.

11. A circuit for simultaneously programming an array of memory cells comprising:
    a comparator for comparing a program voltage associated simultaneously programming the array of memory cells to a reference voltage, and generating an error flag when the threshold voltage is surpassed by the program voltage; and
    a control circuit receiving the error flag, and enabling the simultaneously programming of the memory cells by setting an initial number of memory cells to be simultaneously programmed equal to the pre-established number,
    subdividing the initial number of memory cells to be programmed into subsets of memory cells, executing a program operation for simultaneously programming all the memory cells of each subset of memory cells by forcing a current through all the memory cells of each subset of memory cells, the current having a program voltage associated therewith, comparing by said comparator the program voltage to the threshold voltage during execution of the program operation, and stopping execution of the program operation if the threshold voltage is surpassed, reducing the initial number of memory cells to be simultaneously programmed, and restarting from the subdividing.

12. A circuit according to claim 11, wherein said control circuitry comprises a processor for implementing the steps for simultaneously programming the memory cells.

13. A circuit according to claim 11, wherein the number of memory cells to be simultaneously programmed is iteratively halved by said control circuit each time the threshold voltage is surpassed.

14. A circuit according to claim 11, wherein if the threshold voltage is not surpassed by the program voltage, then said control circuit further performs the following:

verifying that the memory cells of each subset of memory cells have been correctly programmed at the end of the program operation; and setting the number of memory cells to be simultaneously programmed equal to the pre-established number if the memory cells of each subset have been correctly programmed, and restarting from the subdividing.

15. A circuit according to claim 11, wherein the memory cells form a Flash memory.

16. A circuit according to claim 11, further comprising a charge pump for forcing the current through all the memory cells of each subset of memory cells.

17. A non-volatile memory device comprising:

an array of memory cells;

a plurality of bitlines coupled to said array of memory cells;

a charge pump coupled to said plurality of bitlines for providing a program voltage for simultaneously programming said array of memory cells;

a comparator having a first input for receiving the program voltage, and a second input for receiving a threshold voltage, and an output for providing an error flag when the threshold voltage is surpassed by the program voltage; and a control circuit receiving the error flag, and enabling the simultaneously programming of the memory cells by setting an initial number of memory cells to be simultaneously programmed equal to the pre-established number, subdividing the initial number of memory cells to be programmed into subsets of memory cells, executing a program operation for simultaneously programming all the memory cells of each subset of memory cells by forcing a current through all the memory cells of each subset of memory cells, the current having a program voltage associated therewith, comparing by said comparator the program voltage to the threshold voltage during execution of the program operation, and stopping execution of the program operation if the threshold voltage is surpassed, reducing the initial number of memory cells to be simultaneously programmed, and restarting from the subdividing.

18. A non-volatile memory device according to claim 17, wherein said control circuitry comprises a processor for implementing the steps for simultaneously programming the memory cells.

19. A non-volatile memory device according to claim 17, wherein the number of memory cells to be simultaneously programmed is iteratively halved by said control circuit each time the threshold voltage is surpassed.

20. A non-volatile memory device according to claim 17, wherein if the threshold voltage is not surpassed by the program voltage, then said control circuit further performs the following:

verifying that the memory cells of each subset of memory cells have been correctly programmed at the end of the program operation; and setting the number of memory cells to be simultaneously programmed equal to the pre-established number if the memory cells of each subset have been correctly programmed, and restarting from the subdividing.

21. A non-volatile memory device according to claim 17, wherein said array of memory cells are configured so that the non-volatile memory device forms a Flash memory.

* * * * *